United States Patent
Luoh et al.

(10) Patent No.: US 9,116,108 B1
(45) Date of Patent: Aug. 25, 2015

(54) ELECTRON BEAM INSPECTION OPTIMIZATION

(71) Applicant: MACRONIX International Co., Ltd., Hsinchu (TW)

(72) Inventors: Tuung Luoh, Hsinchu (TW); Ling-Wuu Yang, Hsinchu (TW); Ta-Hone Yang, Hsinchu (TW); Kuang-Chao Chen, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 48 days.

(21) Appl. No.: 14/178,293

(22) Filed: Feb. 12, 2014

(51) Int. Cl.
 *G01N 23/225* (2006.01)

(52) U.S. Cl.
 CPC .................. *G01N 23/2251* (2013.01)

(58) Field of Classification Search
 USPC .......................................... 250/310, 307, 306
 See application file for complete search history.

(56) References Cited

U.S. PATENT DOCUMENTS

| 7,904,845 B2 | 3/2011 | Fouquet et al. |
| 2013/0105690 A1* | 5/2013 | Katou et al. ................. 250/307 |

FOREIGN PATENT DOCUMENTS

| CN | 102189331 | 9/2011 |
| TW | 201403651 | 1/2014 |

OTHER PUBLICATIONS

"Office Action of Taiwan Counterpart Application", issued on Jun. 2, 2015, pp. 1-5.

* cited by examiner

*Primary Examiner* — Kiet T Nguyen
(74) *Attorney, Agent, or Firm* — J.C. Patents

(57) ABSTRACT

An electron beam (E beam) inspection optimization is provided, in which a plurality of initial inspection regions in a chip are obtained, wherein a center of each of the initial inspection regions is a defect point. Thereafter, reset inspection regions are regenerated without overlap, wherein each of the reset inspection regions is within a scope covered by a field of view (FOV) and the scope contains at least one of the defect points. Afterwards, a center of the reset inspection region is transferred into an inspection center, and then an E beam inspection is performed on the inspection center.

16 Claims, 3 Drawing Sheets

ELECTRON BEAM INSPECTION OPTIMIZATION

BACKGROUND OF THE INVENTION

1. Field of the Invention

The invention relates to an electron beam inspection method and particularly relates to an electron beam inspection optimization.

2. Description of Related Art

As line width continue to shrink in an IC manufacturing process, control and monitoring of the critical dimension (CD) for the fabrication become more and more important. From the aspect of nano-scale semiconductor technology, it becomes more difficult to accurately inspect defects on the surface structure of a chip.

Currently, an E-beam inspection tool is used to inspect the chip surface structure. However, E-beam inspection is an inspection method of high resolution for small inspected area. The inspection may usually take hours or tens of days depending on the size of the inspected area.

Therefore, various methods have been proposed recently to reduce the inspected points so as to shorten the time required for electron beam inspection. However, they still require a lot of time in order to obtain the chip image and find the defects.

SUMMARY OF THE INVENTION

The invention provides an electron beam inspection optimization, which significantly reduces inspection time and maintains the number of regions under inspection.

The invention further provides an electron beam inspection optimization, which obtains accurate defect information and prevents chip damage.

An exemplary embodiment of the present invention includes an electron beam (E beam) inspection optimization. In the E beam inspection optimization, initial inspection regions in a chip are obtained, wherein a center of each of the initial inspection regions is a defect point, and reset inspection regions are then regenerated without overlap each other. Each of the reset inspection regions is a scope covered by a field of view (FOV), and the scope includes at least one defect point therein. Afterwards, a center of the reset inspection region is transferred into an inspection center, and then an electron beam inspection is performed on the inspection center.

Another exemplary embodiment of the present invention includes an E beam inspection optimization. In the E beam inspection optimization, initial inspection regions in a chip are obtained, wherein a center of each of the initial inspection regions is a defect point. All the defect points are redistributed into a plurality of reset inspection regions based on an area of a FOV. Afterwards, a center of each reset inspection regions is transferred into an inspection center, and then an electron beam inspection is performed on the inspection center.

In an embodiment of the invention, an overlap area of the reset inspection regions is equal to or less than 1% based on a total area of the reset inspection regions.

In an embodiment of the invention, the reset inspection regions are distributed without overlap.

In each embodiment of the invention, a method for obtaining the initial inspection regions includes: setting a region with a critical dimension (CD) equal to or less than a predetermined value as the initial inspection region.

In each embodiment of the invention, a method for obtaining the initial inspection regions includes: setting a region over or under a predetermined value as the initial inspection region according to a design rule.

In each embodiment of the invention, a method for obtaining the initial inspection regions includes: selecting the initial inspection region according to a result of a previous chip defect inspection.

In each embodiment of the invention, a method for obtaining the initial inspection regions includes: setting a region obtained according to a lithographic rule check (LRC) and/or a design rule check (DRC) as the initial inspection region.

In each embodiment of the invention, the initial inspection regions are defect information obtained from other equipment.

In each embodiment of the invention, the FOV in each of the reset inspection regions is 0.1-100 µm.

Based on the above, in exemplary embodiments of the invention, the reset inspection regions are regenerated without overlap each other to serve as the inspection regions, so as to significantly reduce the inspection time and meanwhile maintain the number of the regions under inspection, thereby preventing damage of the chip, which results from excessive overlap of the inspection regions.

It is to be understood that both the foregoing general description and the following detailed description are exemplary, and are not intended to limit the scope of the invention.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
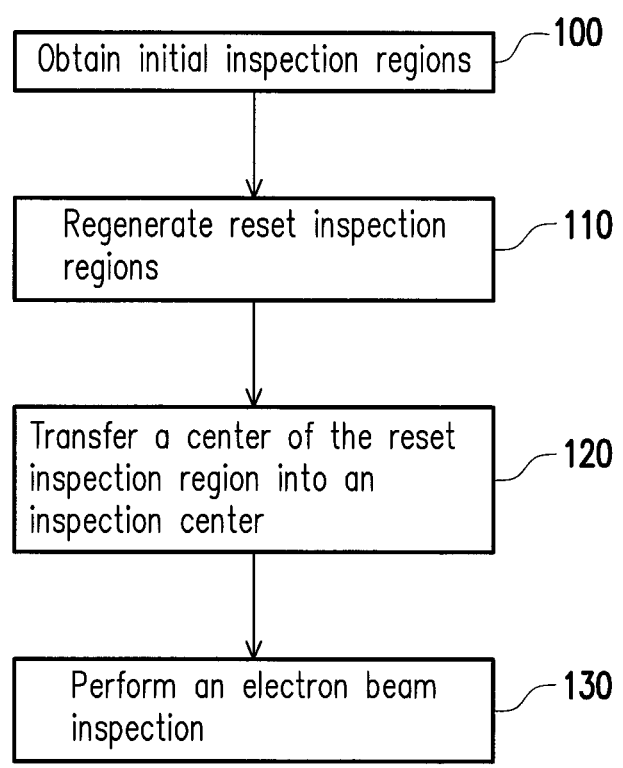
FIG. 1 is a flowchart illustrating an electron beam inspection optimization according to the first embodiment of the invention.

FIG. 1 is a flowchart illustrating an electron beam inspection optimization according to the first embodiment of the invention.

Figure 2A:
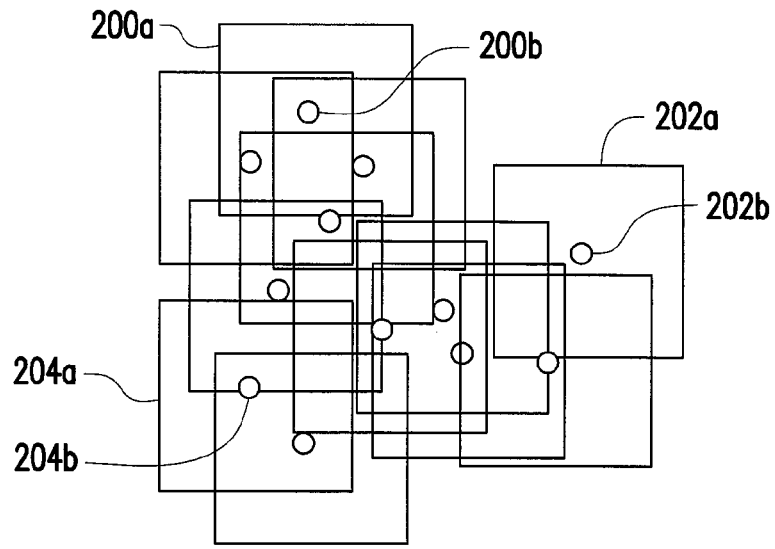
FIG. 2A to FIG. 2C are schematic diagrams illustrating Steps 100 to 120 of the first embodiment.

In FIG. 1, Step 100 is to obtain initial inspection regions. In detail, the initial inspection regions are obtained in a chip, and a center of each of the initial inspection points is a defect point. For example, FIG. 2A illustrates twelve initial inspection regions in the chip, e.g. initial inspection regions 200a, 202a, and 204a. The centers of the initial inspection regions 200a, 202a, and 204a are defect points 200b, 202b, and 204b respectively.

In this embodiment, the method for obtaining the initial inspection regions may be selected form following ways. The first is to set a region with a critical dimension (CD) under a predetermined value as one initial inspection region. Defects occur more easily as the critical dimension gets lower. Therefore, the critical dimension is used as a basis for setting the initial inspection region. Generally, the so-called critical dimension derives from a design database, e.g. a graphic data system (GDS) file of an original design database, a GDS file of a simulated post-optical proximity correction (post-OPC), or a design database obtained through conversion of a simulated tool, etc. The second method for obtaining initial inspection regions is to set a region over a predetermined value or under the predetermined value as one initial inspection region according to a design rule. The third method for obtaining initial inspection regions is to select the initial inspection region according to a result of a previous chip defect inspection, wherein the chip defect inspection is for example a result obtained through inspection of a KLA instrument, and a file format thereof is called KLArf (i.e. KLA result file). Moreover, KLArf output may derive from scanning of various light sources and resolutions, optical scanning, or single scanning of one single condition. The fourth method for obtaining the initial inspection regions is to set a region obtained according to a lithographic rule check (LRC) and/or a design rule check (DRC), etc., as one initial inspection region. The fifth method for obtaining the initial inspection regions is to set defect information obtained from other equipment as the initial inspection regions. The initial inspection regions may be obtained by performing one of the aforementioned methods or combining at least two of the aforementioned methods.

Because many of the initial inspection regions (e.g. regions 200a, 202a, and 204a, etc., in FIG. 2A) usually partially overlap each other. If a portion of the chip receives electron beam irradiation several times for inspection, a circuit structure thereof may be damaged. Therefore, overlap of the inspection regions should be avoided. In view of the above, specific software of an electron beam inspection instrument or other suitable equipment is used to perform the following steps.

Figure 2B:
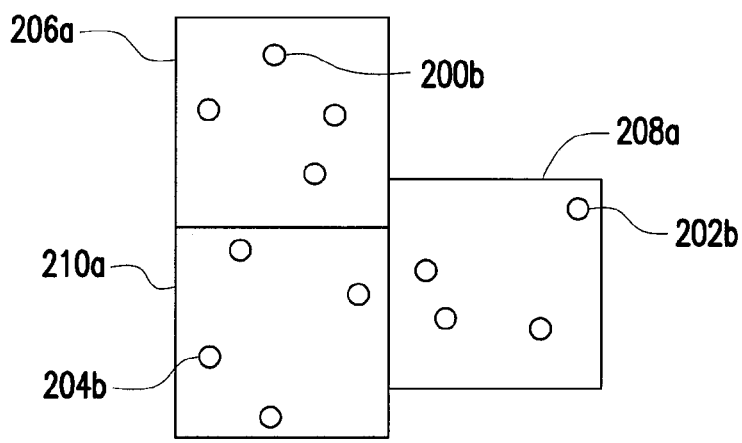

In Step 110, reset inspection regions are regenerated, wherein each of the reset inspection regions that do not overlap each other is in a scope covered by a field of view (FOV), and the scope includes at least one defect point therein. For example, when Step 110 is performed on the twelve initial inspection regions, e.g. 200a, 202a, and 204a, of FIG. 2A, the reset inspection regions 206a, 208a, and 210a, which do not overlap each other, are regenerated, as shown in FIG. 2B. Each of the reset inspection regions 206a, 208a, and 210a is a scope covered by one single FOV, and a plurality of defect points 200b, 202b, and 204b are included therein. For example, the scope covered by one single FOV is 0.1-100 µm, preferably 5-20 µm.

Figure 2C:
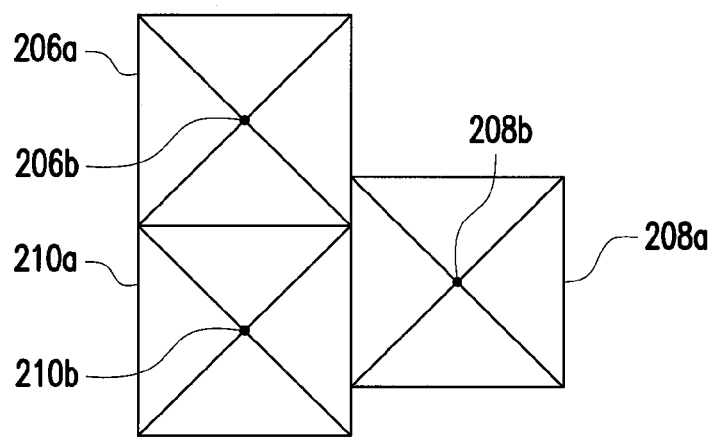

Thereafter, Step 120 is to transfer a center of each of the reset inspection regions to an inspection center. As shown in FIG. 2C, the centers of the reset inspection regions 206a, 208a, and 210a are inspection centers 206b, 208b, and 210b respectively.

Then, Step 130 is to perform an electron beam inspection on the inspection centers, wherein an instrument for the electron beam inspection may be an E-beam inspection tool, a bright field inspection equipment with a light source of a wavelength of 150 nm-800 nm, or a dark field inspection equipment with a laser light source, etc.

Figure 3:
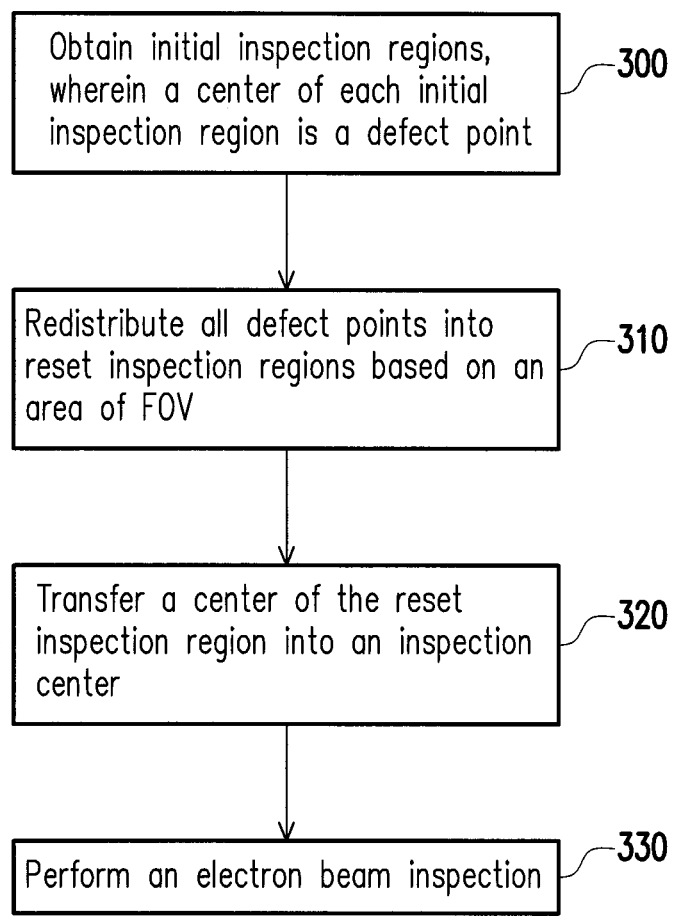
FIG. 3 is a flowchart illustrating an electron beam inspection optimization according to the second embodiment of the invention.

FIG. 3 is a flowchart illustrating an electron beam inspection optimization according to the second embodiment of the invention.

With reference to FIG. 3, in Step 300, initial inspection regions are obtained, and a center of each of the initial inspection regions is a defect point. Regarding methods for obtaining the initial inspection regions, please refer to the first embodiment, and it is possible to obtain the initial inspection regions by one or combination of the aforementioned methods.

Then, in Step 310, all defect points are redistributed into the reset inspection regions based on an area of FOV, wherein the area of FOV is 0.1-100 preferably 5-20 µm, for instance. For example, if the area covered by one single field of view (FOV) is the defect points disposed within 1 µm$^2$ are set as one reset inspection region. Overlap of the reset inspection regions should be avoided if possible. For example, a specific software of the electron beam inspection instrument or other suitable equipment may be utilized to set an overlap area of the reset inspection regions to be equal to or less than 1% based on the total area of the reset inspection regions. Preferably, the overlap area is 0, so as to prevent the reset inspection regions from overlapping each other.

Thereafter, Step 320 is to transfer the center of the reset inspection region to the inspection center.

Following that, Step 330 is to perform an electron beam inspection on the inspection center, wherein the instrument for the electron beam inspection may be an E-beam inspection tool, a bright field inspection equipment with a light source of a wavelength of 150 nm-800 nm, or a dark field inspection equipment with a laser light source, etc., for example.

In light of above, according to the embodiment of the invention, the original inspection regions excessively overlapped are redistributed into the reset inspection regions without overlap based on the area of field of view (FOV). Therefore, the number of the inspection regions is significantly reduced to shorten the inspection time. Meanwhile, the number of the defect points under inspection is maintained. Thus, damage of the chip, which results from excessive overlap of the inspection regions is also avoided.

It will be apparent to those skilled in the art that various modifications and variations can be made to the disclosed embodiments without departing from the scope or spirit of the invention. In view of the foregoing, it is intended that the invention covers modifications and variations of this disclosure provided that they fall within the scope of the following claims and their equivalents.

What is claimed is:

1. An electron beam inspection optimization, comprising:
   obtaining a plurality of initial inspection regions in a chip, wherein a center of each of the initial inspection regions is a defect point;
   regenerating a plurality of reset inspection regions without overlap each other, wherein each of the reset inspection regions is a scope covered by a field of view (FOV) and the scope has at least one of the defect points therein;
   transferring a plurality of centers of the reset inspection regions into a plurality of inspection centers; and
   performing an electron beam inspection on the inspection centers.

2. The electron beam inspection optimization according to claim 1, wherein a method for obtaining the initial inspection regions in the chip comprises: setting a region with a critical dimension (CD) equal to or less than a predetermined value as the initial inspection region.

3. The electron beam inspection optimization according to claim 1, wherein a method for obtaining the initial inspection regions in the chip comprises: setting a region over or under a predetermined value as the initial inspection region according to a design rule.

4. The electron beam inspection optimization according to claim 1, wherein a method for obtaining the initial inspection regions in the chip comprises: selecting the initial inspection region according to a result of a previous chip defect inspection.

5. The electron beam inspection optimization according to claim 1, wherein a method for obtaining the initial inspection regions in the chip comprises: setting a region obtained according to a lithographic rule check (LRC) and/or a design rule check (DRC) as the initial inspection region.

6. The electron beam inspection optimization according to claim 1, wherein the initial inspection regions are defect information obtained from other equipment.

7. The electron beam inspection optimization according to claim 1, wherein the FOV in each of the reset inspection regions is 0.1-100 μm.

8. An electron beam inspection optimization, comprising:
obtaining a plurality of initial inspection regions in a chip, wherein a center of each of the initial inspection regions is a defect point;
redistributing all the defect points into a plurality of reset inspection regions based on an area of a field of view (FOV);
transferring a plurality of centers of the reset inspection regions into a plurality of inspection centers; and
performing an electron beam inspection on the inspection centers.

9. The electron beam inspection optimization according to claim 8, wherein an overlap area of the reset inspection regions is equal to or less than 1% based on a total area of the reset inspection regions.

10. The electron beam inspection optimization according to claim 8, wherein the reset inspection regions are distributed without overlap.

11. The electron beam inspection optimization according to claim 8, wherein a method for obtaining the initial inspection regions in the chip comprises: setting a region with a critical dimension (CD) equal to or less than a predetermined value as the initial inspection region.

12. The electron beam inspection optimization according to claim 8, wherein a method for obtaining the initial inspection regions in the chip comprises: setting a region over or under a predetermined value as the initial inspection region according to a design rule.

13. The electron beam inspection optimization according to claim 8, wherein a method for obtaining the initial inspection regions in the chip comprises: selecting the initial inspection region according to a result of a previous chip defect inspection.

14. The electron beam inspection optimization according to claim 8, wherein a method for obtaining the initial inspection regions in the chip comprises: setting a region obtained according to a lithographic rule check (LRC) and/or a design rule check (DRC) as the initial inspection region.

15. The electron beam inspection optimization according to claim 8, wherein the initial inspection regions are defect information obtained from other equipment.

16. The electron beam inspection optimization according to claim 8, wherein the area of the FOV is 0.1-100 μm.

\* \* \* \* \*